United States Patent
de Sandre

(10) Patent No.: US 6,944,038 B2
(45) Date of Patent: Sep. 13, 2005

(54) NON-VOLATILE NOR-TYPE CAM MEMORY

(75) Inventor: Guido de Sandre, Brugherio (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 135 days.

(21) Appl. No.: 10/664,794

(22) Filed: Sep. 19, 2003

(65) Prior Publication Data

US 2004/0130925 A1 Jul. 8, 2004

(30) Foreign Application Priority Data

Sep. 20, 2002 (IT) .................................. RM2002A0465

(51) Int. Cl.$^7$ .............................................. G11C 15/00
(52) U.S. Cl. ................ 365/49; 365/185.18; 365/185.05
(58) Field of Search .............................. 365/49, 185.18, 365/185.05, 185.24, 185.26

(56) References Cited

U.S. PATENT DOCUMENTS

| | | | |
|---|---|---|---|
| 5,051,948 A | * | 9/1991 | Watabe et al. ................. 365/49 |
| 5,111,427 A | * | 5/1992 | Kobayashi et al. ............ 365/49 |
| 6,005,790 A | * | 12/1999 | Chan et al. .................... 365/49 |
| 6,373,739 B1 | * | 4/2002 | Lien et al. ..................... 365/49 |
| 6,542,392 B2 | * | 4/2003 | Yanagawa ..................... 365/49 |

OTHER PUBLICATIONS

U.S. Appl. No. 10/676,731, filed Oct. 1, 2003, de Sandre.

* cited by examiner

Primary Examiner—Connie C. Yoha
(74) Attorney, Agent, or Firm—Lisa K. Jorgenson; E. Russell Tarleton; Seed IP Law Group PLLC

(57) ABSTRACT

A non-volatile CAM-type memory having a multiplicity of memory cells ordered into a matrix of rows and columns, a word line and a match line associated with every row of cells and a first and a second bit line associated with every column of cells. In order to speed up the search for a data item in the memory and to simplify the circuit structure of the memory, each row of cells is associated with a ground control line and a ground line and every cell also includes a first controlled electronic switch connected between a ground line and a match line associated with the row containing the cell and having a control terminal connected to a match node of the cell and a second controlled electronic switch connected between the match node of the cell and the ground line associated with the row containing the cell, and further having a control terminal connected to the ground control line associated with the row containing the cell.

19 Claims, 3 Drawing Sheets

NON-VOLATILE NOR-TYPE CAM MEMORY

BACKGROUND OF THE INVENTION

1. Field of the Invention

The present invention relates to semiconductor memories and, more particularly, a non-volatile memory of the CAM type, i.e., capable of being addressed by means of its content.

2. Description of the Related Art

As is known, semiconductor memories, such as used in microprocessors, computers, and the like, consist of a large number of cells arranged in rows and columns to form a cell matrix. Each cell contains a binary information element (bit) and to each row of the matrix there corresponds a binary word whose length depends on the number of columns.

At present the most widely used memories are the static and dynamic RAMs (Random Access Memories) in which the word memorized in a row of the matrix can be accessed by simply furnishing its address. In the case of a CAM cell matrix, on the other hand, a binary word stored in a row can be looked for by inserting the word to be found in a comparison register associated with the matrix and comparing the content of the comparison register with the content of each row. The result of the search is made available by means of the observation of the voltage of a match line common to all the cells of a row. In particular, if the value of each bit of the word contained in the register coincides with that of the corresponding bit of the word of the row in question, the voltage of the match line will remain unchanged at a pre-charge value, while failure of even a single bit to coincide with its counterpart in the other binary word will cause the voltage of this line to assume ground value. In a cell matrix, obviously, this operation is carried out simultaneously for all the binary words of each row. In other words, a CAM memory is accessed by means of a comparison with its specific content rather than by means of a specific address.

There exist both volatile CAM cells and non-volatile CAM cells. The volatile CAM cells were initially developed from static RAM cells (SRAM) by simply adding transistors in such a manner as to provide an output connected to a match line. More recently, dynamic RAM cells (DRAM) have also been used as basic cells to obtain advantages in terms of area and cost.

CAM cells, irrespective of whether they are made with SRAMs or DRAMs, are relatively fast, but their binary content is lost as soon as the supply voltage is switched off. They therefore have to be rewritten at every new start-up by using a separate non-volatile memory unit, a hard disk for example. In CAMs of a non-volatile type, on the other hand, the data remain stored even when the voltage is cut off and, what is more, each cell calls for a smaller number of transistors and therefore a smaller silicon area than cells realized with SRAMs and DRAMs.

A known non-volatile CAM memory cell 210, as described for example in U.S. Pat. No. 6,317,439 B1 and shown in FIG. 1 of the drawings attached hereto, comprises two transistors 211, 212 of the floating-gate type that have their gate terminals connected to the same word line (WL) 220, their source terminals both connected to a match line (ML) 230 and their drain terminal each connected to one of the bit lines (BL,BL) 241, 242. In general, any non-volatile memory element could take the place of the two transistors. A multiplicity of cells equal to the cell 210 of FIG. 1, ordered in rows and columns, forms a CAM memory matrix, schematically represented in FIG. 2, where each row of cells comprises a pair of electric lines, respectively a word line 220 and a match line 230, and each column comprises two bit lines indicated by 241, 242.

As may be noted, all the word lines 220 are connected to an external row control block 360, the match lines 230 have one of their ends connected to this same block 360, while at the other end they terminate in sense amplifiers 380. Pilot circuits 371 and 372 are coupled, respectively, with the bit lines 241 and 242 to bias them during the search, writing, and cancelling operations. All the bit lines of the matrix lead to a block 370 that performs the function of register and control circuit for the search. The block 370 may contain a word for comparison purposes that is applied to its terminal indicated by DATA IN. The line control block 360 applies adequate voltages to the word lines and the match lines during the search, writing, and cancelling operations by selecting one row of the cell matrix on the basis of an input signal ADRIN. The sense amplifiers 380 detect a voltage variation on the respective match lines 230 when the input word, contained in block 370, does not coincide with the word memorized in the corresponding row of the matrix.

The threshold voltages of the transistors 211, 212 can be modified by acting on the terminals thereof to vary the electric charges of the respective floating-gates. The threshold voltage is determined by technological and design parameters and is "low" when electrons are not accumulated in the floating-gate transistors and "high" when they are being accumulated. The high threshold voltage is fixed at a value grater than the supply voltage Vcc of the memory circuits (for example Vcc=5V), while the low voltage, as a general rule, is not greater than 1 V. Conventionally, when the threshold voltage of the transistor 211 is set high, while that of transistor 212 is set low, the elementary information stored in the cell 210 is a logic 1. When the thresholds are set in the opposite manner, a logic 0 is memorized. It is also possible to memorize a third state X, known as the don't care state, by programming the thresholds of both elements to be high (>Vcc). The associative memories capable of memorizing these three states, rather than just the two basic logic states, are known as ternary memories. They are particularly advantageous in some applications.

Before undertaking the programming, the information content of the cell is cancelled by applying a sufficiently negative voltage to the word line 220 (for example, from −8V to −10V) and a positive voltage to the match line 230 (for example from 5V to 7V). The combination of these voltages on the gate and source terminals of the transistors 211, 212 causes a tunnel effect capable of removing electrons from the floating gate of the transistor that has the high threshold voltage and thus reducing it to the low threshold voltage. This operation exerts an effect (of lesser entity) also on a transistor already set to a low threshold voltage. One therefore needs appropriate algorithms to re-program the cells that have had their thresholds excessively lowered and thus obtain a well controlled final value. The value of the voltage on the bit lines 241, 242 does not exert any effect on the cancellation.

The operation of writing a CAM cell 210 is carried out by applying a high voltage to the word line 220 (for example, 8V) and setting the match line at ground voltage. When a logic 1 is to be memorized, the threshold of transistor 211 has to be stepped up, leaving the threshold of transistor 212 low, and one therefore applies an intermediate voltage (5V, for example) to the bit line 241, leaving the other bit line 242 unconnected. To memorize a logic 0, on the other hand, one operates on the bit lines in the opposite manner to raise the threshold of transistor 212. When the don't care state X has to be memorized, the intermediate voltage is applied to both the bit lines 241 and 242.

The search operation in the cell 210 is performed by applying the supply voltage $V_{CC}$ to the word line 220, pre-changing the match line 230 with the voltage VCC and applying appropriate voltages to the bit lines 241, 242. In particular, when the memorized data is a logic 1 (threshold of 211 high, threshold of 212 low) and the same bit is looked for in the cell, the bit line 241 is connected to ground, while the bit line 242 is connected to the supply voltage $V_{CC}$. In that case, since neither of the transistors 211, 212 conducts, the voltage on the match line does not change, thus confirming that the stored bit matches the looked-for bit. When a logic 0 is being looked for, the bit lines have to be biased in the manner opposite to the previous case, so that this time it will be the transistor 212 that has the low threshold, conducts and therefore tends to reduce the voltage of the match line 230 to ground. When the memorized state is X, neither of the two transistors 211 and 212 can conduct and therefore looked-for bit and the memorized bit will always coincide.

The operations that have just been described are carried out simultaneously in all the cells of each row of the matrix. When the word contained in block 370 is found in a row of the matrix, the voltage of the match line corresponding to that row does not vary and the sense amplifier 380 connected to that match line provides a signal to a priority encoding block 385 that generates an output signal ADROUT that identifies the position in the matrix of the word that corresponds to the looked-for word. Vice versa, when the two words differ by even a single bit, the amplifier 380 detects the voltage variation on the match line and no output signal is generated.

In the described memory matrix, the low threshold of the transistors 211, 212 should be accurately controlled to assure that it will always be above a minimum predetermined value, 0.5 V for example. In this connection, let us now consider a matrix cell in which a bit is memorized (i.e., one of the transistors 211, 212 has a low threshold). If this cell forms part of a row in which there is no match when the previously described search operation is carried out, the voltage of the corresponding match line will always tend to assume the ground voltage. During the search it may happen that the gate and drain terminals of one of the two transistors 211, 212, the one with the low threshold, are at the voltage $V_{CC}$ and that the voltage difference between the gate terminal and the source terminal (connected to the match line) of the same transistor exceeds its threshold voltage when the potential of the match line approaches ground voltage. In that case the transistor under consideration will conduct a parasitic current that charges the match line and increases as the gate-source voltage becomes greater. If several cells in the same row conduct such parasitic currents, the voltage of the match line will not be sufficiently different from its initial pre-charge value (for example, $V_{CC}$), so that, in a limited case, it may become difficult to detect a non-match during the search. The effect of the parasitic currents can be neglected for the purposes of signal generation on the match line only when the low threshold voltage of the transistors 211, 212 is greater than 0.5V. This sets some very restrictive constraints as far as the cancellation algorithm is concerned, which will have to become more and more accurate as the voltage applied to the word line diminishes. For example, a voltage of 1.8V on the word line would imply that all the low threshold voltages of all the cells would have to lie between 0.5V and 1V. There still remains the problem of dissipating the power due to the parasite currents. The worst case occurs when there is a match condition for half the cells in a row and a non-match condition for the other half. The match line voltage comes down to a value intermediate between Vcc and ground and a resistive path comes into being between the two potentials.

One should also consider the unfavorable, though not by any means unusual case in which none of the cells of a column of the matrix produce a match, while all the other cells in the matrix are in a match condition; in that case the current passing through one of the bit lines associated with that column has to discharge the capacitance associated with all the match lines of the matrix. In every cell forming part of the column under consideration, indeed, one of the transistors 211 or 212, when conducting, will connect one of the bit lines, which is at ground potential, to the match line of the row that contains the cell that is at the voltage $V_{CC}$. The match lines to be discharged constitute a relatively high overall capacitative load (for example, 100 pF); in this particular case, therefore, the described matrix will need a relatively long time for carrying out the search operation.

When only one cell in a row of the described cell matrix is devoid of a match, the discharge of the match line associated with that row is slower than in the case where a match is lacking in several cells. With a view to speeding up the search operation and also to reduce the dissipation during the switching, the voltage excursion of the match line is reduced by making sure that the voltage of that line will not arrive at ground voltage (starting from the voltage $V_{CC}$), but rather at a low value always greater than ground. This is obtained by using adequate voltage recovery circuits outside the memory matrix and connecting them to the match line during the search. However, the addition of the of the recovery circuits complicates the circuit structure of the known memory described above.

BRIEF SUMMARY OF THE INVENTION

The disclosed embodiments of the present invention are directed to resolving the problems of the known CAM memory described hereinabove and, more particularly, to avoid the limitation imposed on the low threshold voltage of the transistors in order to simplify the cancellation algorithm, render the search operation more rapid and to simplify the circuit structure of the memory.

In accordance with one embodiment of the invention, a non-volatile cam-type memory is provided that includes a multiplicity of memory cells ordered into a matrix of rows and columns; a word line and a match line associated with every row of cells; a first and a second bit line associated with every column of cells; and a ground control line and a ground line associated with every row of cells. Each memory cell includes a first non-volatile memory element having a control terminal connected to the word line associated with the row containing the cell, a first terminal connected to the first bit line associated with the column containing the cell, and a second terminal connected to a match node of the cell; a second non-volatile memory element having a control terminal connected to the word line associated with the row containing the cell, a first terminal connected to the second bit line associated with the column containing the cell and a second terminal connected to the match node of the cell; a first controlled electronic switch connected between the ground line and the match line associated with the row containing the cell and having a control terminal connected to the match node of the cell; and a second controlled electronic switch connected between the match node of the cell and the ground line associated with the row containing the cell and having a control terminal connected to the ground control line associated with the row containing the cell.

In accordance with a method of the present invention, the method is directed to carrying out the search for a binary word stored in a CAM-type memory of the type described above. The method includes associating an element of a comparison register with each column of the matrix; inserting in the comparison register a word to be searched; comparing the content of the register bit by bit with the content of each row in accordance with the following operations: applying a first pre-determined voltage to the ground line, applying a second pre-determined voltage to the match line, applying a third pre-determined voltage to the word line, applying to the ground control line a fourth pre-determined voltage sufficient to close the electronic switch and to discharge the match node of the cells of the row and immediately thereafter applying the first pre-determined voltage to the same ground control line, subsequently biasing the bit lines of every column by applying a pre-determined search voltage to one of the first and second bit lines according to whether the respective bit of the comparison register is in a first or a second logic state, monitoring the voltage of the match line, and generating a match signal whenever the voltage on the match line does not vary or a no-match signal when the voltage on the match line varies.

As will be readily appreciated from the foregoing, the memory, memory cell, and method of the present invention will have application in memories used in microprocessors, computers, computing systems, ASICs, and the like where CAM memories are used to redirect data from defective memory cells. The present invention avoids the limitation imposed on low threshold voltage of field effect transistors in order to simplify the cancellation process and to simplify and speed up the memory.

BRIEF DESCRIPTION OF THE SEVERAL VIEWS OF THE DRAWING(S)

The invention will be more clearly understood from the following description of a particular embodiment thereof, which is given purely by way of example and is not to be considered limitative in anyway, the description making reference to the attached drawings of which:

DETAILED DESCRIPTION OF THE INVENTION

Figure 3:
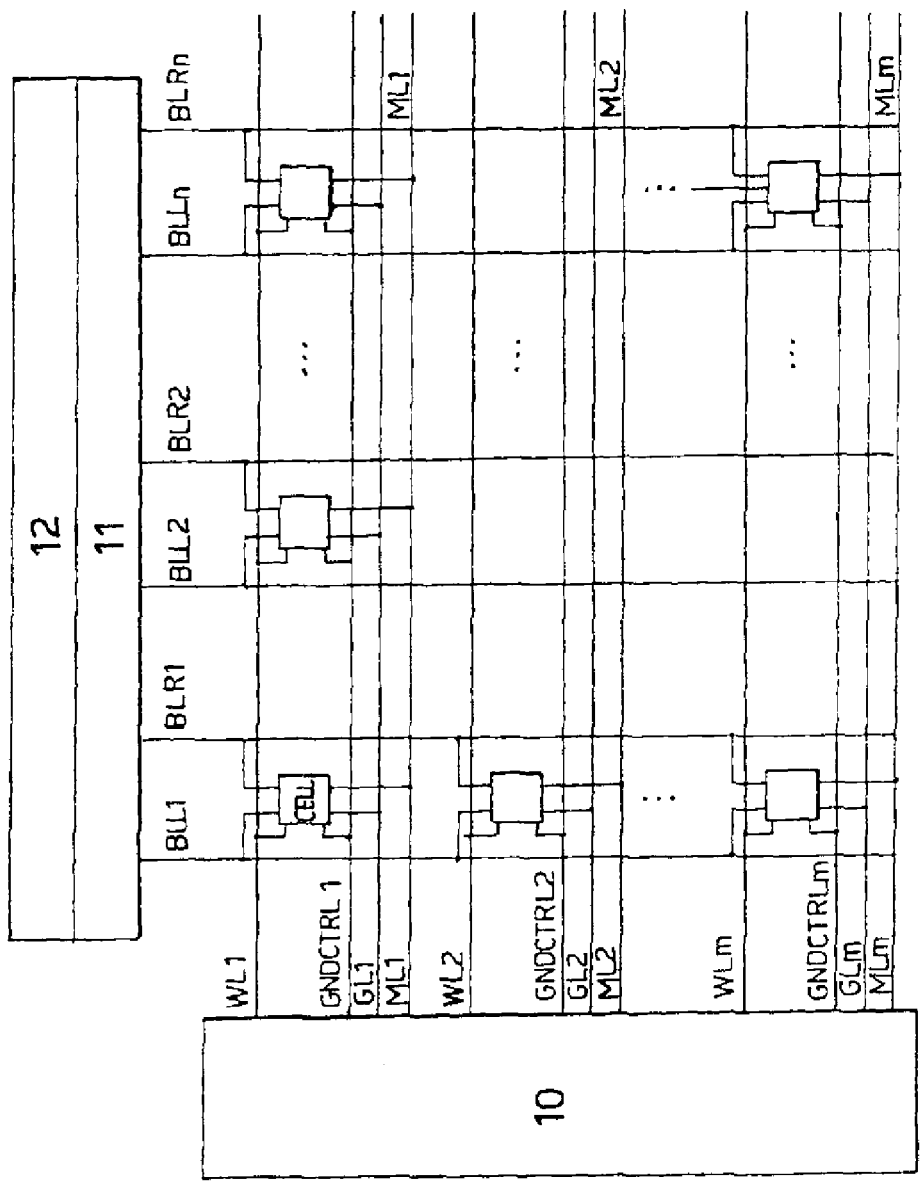
FIG. 3 shows a circuit diagram of a non-volatile CAM memory in accordance with the invention.

As can be seen in FIG. 3, the memory in accordance with the invention comprises a multiplicity of cells CELL ordered in a matrix of m rows and n columns. Each row of the matrix comprises four electric lines, respectively a word line WL1-m, a match line ML1-m, a ground line GL1-m, and a ground control line GNDCTRL1-m, which are connected to a block 10 performing the function of row decoder. Each column comprises two lines, a right-hand bit line BLR1-n and a left-hand bit line BLL1-n, connected to a block 11 performing the function of column decoder and a block 12 performing the function of controlling the search operation. All the cells in the same row are connected to the four lines associated with the row and all the cells in the same column are connected to the two lines associated with the column.

Figure 4:
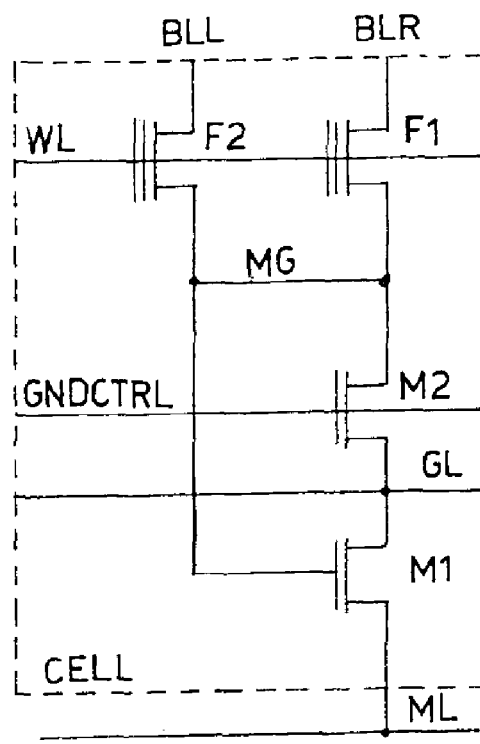
FIG. 4 shows a circuit diagram of a non-volatile CAM cell in accordance with the invention.

As can be seen from the circuit diagram of FIG. 4, each cell comprises four transistors: two floating-gate type transistors F1 and F2 with function of non-volatile memory elements and two transistors M1 and M2 that act as electronic switches. The two transistors F1 and F2 have their source terminals connected to a common electric terminal MG that will henceforth be referred to as a match node, their gate control terminals both connected to a word line WL and their drain terminals connected, respectively, to a right-hand bit line BLR and left-hand bit line BLL. The transistor M1 has its gate terminal connected to the match node MG and its source-drain section connected to a ground line GL and a match line ML. The transistor M2 has its gate terminal connected to a ground control line GNDCTRL and the source-drain section connected between the match node MG and the ground line GL.

In each cell, similarly to the case of U.S. Pat. No. 6,317,349 B1, when a low threshold is fixed for F2 (for example, 1V) and a high threshold for F1 (for example, 5.5V), a logic 0 is memorized, while a logic 1 is memorized when the thresholds are set in the opposite manner. When both threshold are programmed with a high value, the don't care state X is memorized. The proposed cell therefore also constitutes a ternary CAM memory.

To write a bit into a CAM cell like the one of FIG. 4 that has already been cancelled (transistors F1 and F2 with low thresholds), a high voltage is first applied to the word line WL (for example, from 5V to 8V). If the voltage of the ground control line GNDCTRL is set at a high value (for example, 5V to 8V) and the ground line GL is maintained at ground potential, thus enabling transistor F2 to conduct, the match node MG will likewise be connected to ground potential. To memorize a logic 1, an intermediate voltage is applied to the left-hand bit line, leaving the right-hand bit line BLR unconnected. Therefore, the threshold of transistor F2 increases and the threshold of transistor F1 remains low. When a logic 0 is to be memorized, one acts in the opposite manner on the bit lines to step up the threshold of transistor F1. An intermediate voltage is applied to both the bit lines when the don't care state X is to be memorized.

When a bit in the cell is to be cancelled, the substrate of the transistors F1, F2, common to all the cells, is fixed at a high voltage (for example, 8V), a negative voltage is applied to the word line WL and the ground control line GNDCTRL is connected to ground, leaving the other lines unconnected. In this way the electrons are removed from the floating gate of the transistor of the pair F1,F2 that has the high threshold, while the threshold of the other is altered to a far smaller extent.

During the search operation, ground potential ($V_{GL}$) is initially applied to the ground line GL, while low positive voltage ($V_{ML}$)(for example, from 0.8V to 1.8V) is applied to the match line ML and a sufficiently high voltage (for example, from 5V to 8V)is applied to the ground control line GNDCTRL in order to cause the transistor M2 to conduct; the node MG will thus become discharged and assume the voltage of the line GL. When the bit to be sought in the cell is a 0, a voltage $V_{SEARCH}$ (for example, from 1.2 to 2V) is applied to the right-hand bit line BLR and the left-hand bit line BLL is left unconnected. Setting an appropriate voltage, less than the high threshold of the transistors F1,F2, (for example, 4V) on the word line WL and applying ground potential to the ground control line GNDCTRL in order to shut down the transistor M2, neither of the transistors F1 and F2 will conduct, the match node MG is not charged, the transistor M1 remains off and the value of the voltage on the match line ML does not change: the stored bit matches the bit that is being sought, which is a 0. Vice versa, when the looked-for bit is a 1, the same voltage $V_{SEARCH}$ is applied to the left-hand bit line BLL, leaving the right-hand bit line BLR unconnected. In that case transistor F1 remains off, while transistor F2 conducts and causes the voltage of the internal node MG to increase to the value $V_{SEARCH}$. This voltage causes the switching on of transistor M1; consequently, the match line ML is brought to ground potential: the stored bit does not match the bit that is being sought and is therefore a 0. When the memorized state is the don't care state X, neither of the transistors F1 and F2 can conduct and the voltage on the line ML remains unchanged. The memorized state and the stored bit will therefore always match. The node MG is discharged at the end of each search operation, so that the transistor M2 becomes switched on again with the application of a positive voltage to the line GNDCTRL.

Referring to the cell matrix shown in FIG. 3, during the search for a word stored in a register contained in block 12, block 11 applies the voltage $V_{SEARCH}$, which it receives from a regulator (not shown), to one of the bit lines of each of the n pairs (leaving the other bit line unconnected), while block 10 sets the voltages on the word lines WL1-m, the ground lines GL1-m, the ground control lines GNDCTRL1-m and the match lines ML1-m of each of the m rows. Lack of a match between the word memorized in a row and the word that is being looked, even when this is due only to a single bit, will cause a change in the voltage of the match line ML associated with that row, which can be detected by means of a sense amplifier (connected to the same line ML, but not shown in FIG. 3).

The above description of the memory makes it clear that the transistors M1 forming part of the cells that are situated in the same row of the matrix are in parallel with each other, because they are connected between a ground line GL and a match line ML. Bearing in mind both this position in the circuit and the functioning of the cells during the search, each row of the matrix performs during the search the logic function of a NOR gate that has the n MG nodes as its inputs and the match line M1 as its output. In fact, if the voltages that can be assumed by the node MG of each cell, i.e., the voltage $V_{SEARCH}$ (when there is no match) and ground potential (when there is a match), are interpreted, respectively, as logic 1 and logic 0 and the states of variation of the voltage and non-variation of the voltage of the match line MG are interpreted, respectively, as logic 0 and logic 1, according to the logic of a NOR gate, a logic 1 on the output side of the gate will be obtained only when all the inputs are 0. For this reason, the memory in question can be called a NOR-type CAM memory.

During the search the match node MG of each individual cell is not connected to the match nodes MG of the cells situated on other columns, but by means of the bit lines BLR and BLL is connected only to the match nodes of any cells in a non-matching state forming part of the same column.

Figure 2:
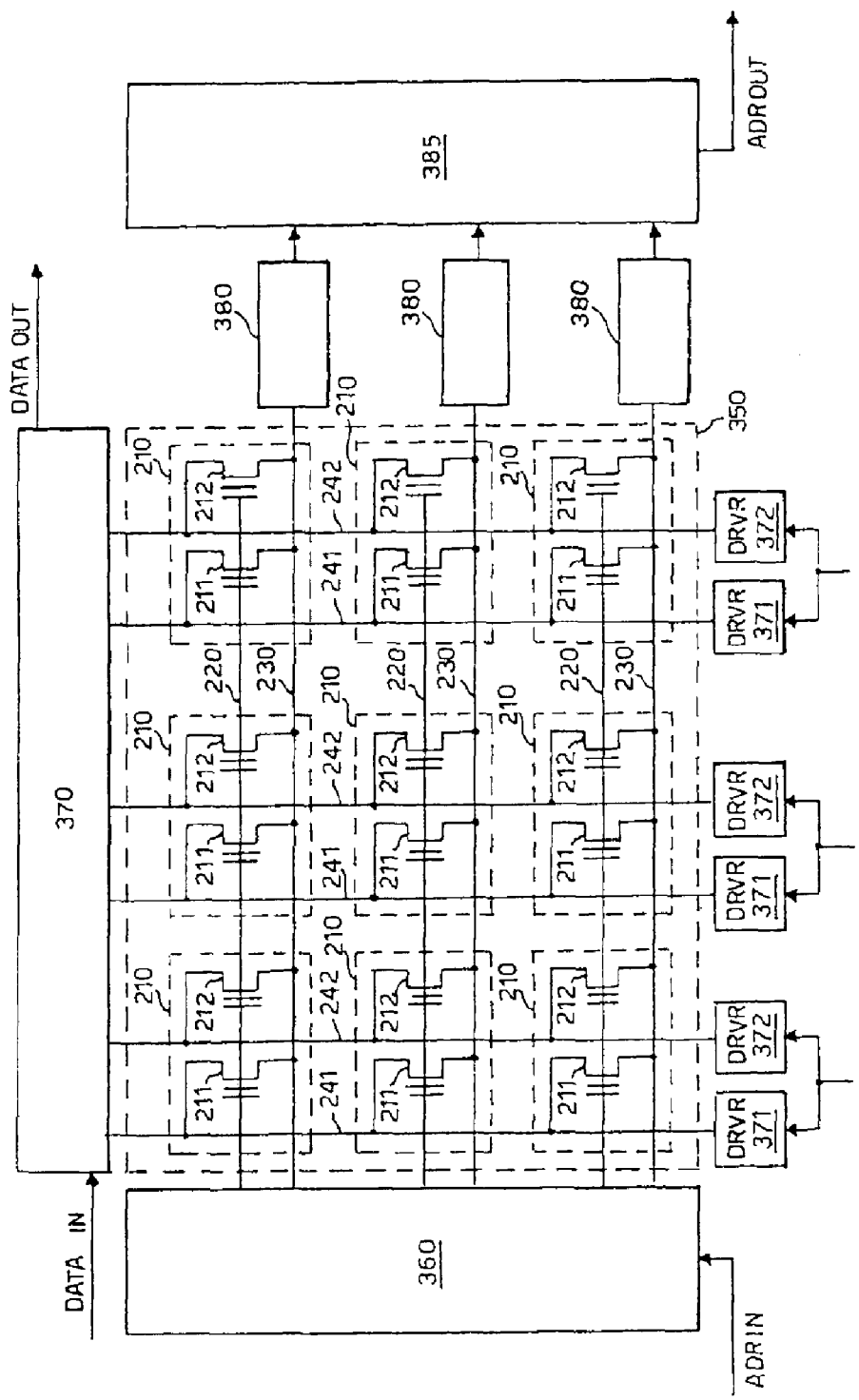
FIG. 2 shows a circuit diagram of a non-volatile CAM memory comprising a matrix of cells like the one of FIG. 1.

It is easy to note that the present invention has numerous advantages as compared with the prior art. In particular, in the unfavorable case considered in connection with U.S. Pat. No. 6,317,349 B1, in which all the cells of a matrix column are in the non-matching state, the currents in the bit lines will charge only the nodes MG of the cells on the same column, so that they will charge an overall capacitance having a much smaller value than the capacitances that have to be discharged—all other conditions being identical—in the case of the memory of FIG. 2, i.e., the capacitances associated with all the match lines of the matrix.

Figure 1:
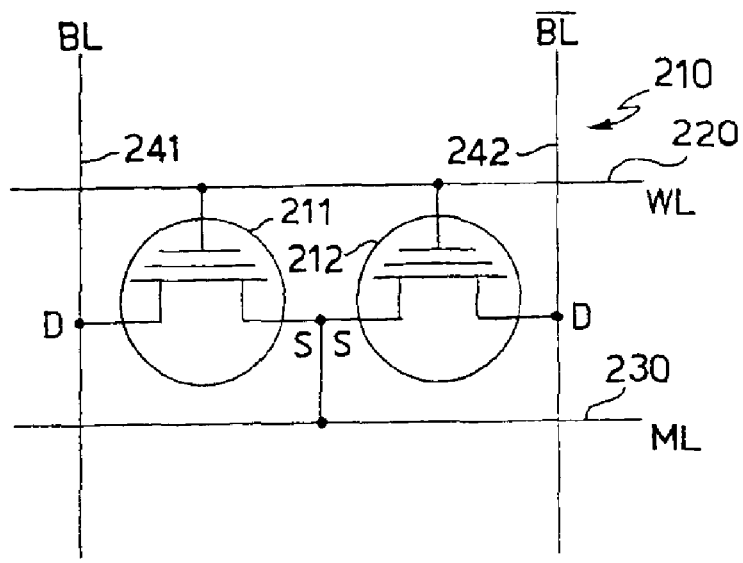
FIG. 1 shows a circuit diagram of a known non-volatile CAM cell.

According to the invention, the source terminals of the transistors F1 and F2 of every cell (coinciding with the respective nodes MG) are not directly connected to the match line ML as they are in FIG. 1. When a data item is memorized in a row (all the cells with at least one of F1 and F2 having a high threshold), parasitic currents cannot be produced. These currents are generated only in rows of which the content has been cancelled (both F1 and F2 with a low threshold) and can be eliminated by bringing the corresponding word lines to a low voltage (for example, from ground potential to −2V). In each case the parasitic currents will—at the very worst—charge the MG node and not the respective match line ML. Consequently, erroneous non-match valuations are avoided, the search is completed more rapidly and the low threshold of F1,F2 does not have to be accurately controlled, thus simplifying the cancellation algorithm.

During the search the maximum voltage excursion of the match line of a row in which there is no match amounts to $V_{ML}-V_{GL}$, where $V_{ML}$ and $V_{GL}$ are the voltages applied, respectively, for pre-charging the match line and to the ground line. This voltage excursion causes power dissipation. Thanks to the configuration of the memory cell in accordance with the invention, this dissipation can be reduced to a minimum by means of appropriate dimensioning of the transistors M1 and appropriate biasing of the lines GL and ML. More particularly, before the search is commenced, the ground line GL is pre-charged to a positive voltage value (1.8V, for example) rather than ground potential, and the match line ML is pre-charged to a low voltage (for example, from ground to 0.5V) rather than a higher voltage (greater than $V_{GL}$). During the search, when the voltage $V_{SEARCH}$ is applied to the gate terminal of the transistor M1, a non-match will cause this transistor to conduct and the match line ML will become charged from the low potential to the value $V_{SEARCH}-V_T(M1)$, where $V_T(M1)$ is the threshold voltage of the transistor M1. In this case the voltage excursion of the match line amounts to $V_{SEARCH}-VT(M1)-V_{ML}$. Therefore, given the same voltage $V_{SEARCH}$, the voltage excursion of the match line ML is reduced by simply choosing an adequate threshold voltage for the transistor M1. Consequently, the search is speeded up and the dynamic power dissipation is reduced without there being any need for voltage recovery circuits as in conventional techniques.

Although only a single embodiment of the present invention has here been illustrated and described, it is clear that numerous variants and modifications are possible without overstepping the inventive concept. For example, the block 11 could be designed in such a way that during the search the bit lines of every column are biased to, respectively, a voltage of $V_{SEARCH}$ and ground potential rather than having one at the voltage $V_{SEARCH}$ and the other at no potential (because left unconnected or connected to a high-impedance terminal). In this way one avoids having to use the three-state device for biasing each pair of bit lines that would otherwise be necessary in order to have the high-impedance state. Furthermore, the initial value of the voltage of the MG node need not be set to ground potential, but could be a positive voltage (1.8V, for example). In that case the voltage $V_{SEARCH}$ (which charges this node when there is no match)

has to be higher, but one obtains the advantage of reducing the voltage excursion of the node MG and the dissipations associated therewith. Lastly, the ground line GL and the match line ML of every row may be pre-charged to a low potential $V_{low}$ (1.8V, for example) and, consequently, the voltage $V_{SEARCH}$ will have to be higher than $V_{low}$ if the transistor M1 of each cell without a match is to conduct. In this variant of the invention the search is carried out by bringing the match lines ML of the cell matrix to ground potential for brief intervals of time. The voltage of the match lines ML of rows in which there is a match remain at ground potential, while the voltage of the match lines corresponding to rows without a match returns to the potential $V_{low}$.

All of the above U.S. patents, U.S. patent application publications, U.S. patent applications, foreign patents, foreign patent applications and non-patent publications referred to in this specification and/or listed in the Application Data Sheet, are incorporated herein by reference, in their entirety.

From the foregoing it will be appreciated that, although specific embodiments of the invention have been described herein for purposes of illustration, various modifications may be made without deviating from the spirit and scope of the invention. Accordingly, the invention is not limited except as by the appended claims and the equivalents thereof.

What is claimed is:

1. A non-volatile CAM-type memory, comprising:
    a multiplicity of memory cells ordered into a matrix of rows and columns;
    a word line and a match line associated with every row of cells;
    a first and a second bit line associated with every column of cells;
    a ground control line and a ground line associated with every row of cells; and
    each cell comprising:
        a first non-volatile memory element having a control terminal connected to the word line associated with the row containing the cell, a first terminal connected to the first bit line associated with the column containing the cell and a second terminal connected to a match node of the cell, and
        a second non-volatile memory element having a control terminal connected to the word line associated with the row containing the cell, a first terminal connected to the second bit line associated with the column containing the cell and a second terminal connected to the match node of the cell;
        a first controlled electronic switch connected between the ground line and the match line associated with the row containing the cell and having a control terminal connected to the match node of the cell, and
        a second controlled electronic switch connected between the match node of the cell and the ground line associated with the row containing the cell and having a control terminal connected to the ground control line associated with the row containing the cell.

2. The CAM-type memory of claim 1, wherein the first and the second non-volatile memory element of each cell are transistors of the floating-gate type in which the first terminal is the drain and the second terminal is the source, and the first and the second controlled electronic switch of each cell are MOS transistors.

3. The CAM-type memory of claim 1, wherein each cell is configured such that:

when the first non-volatile memory element has a low threshold voltage and the second non-volatile memory element has a high threshold voltage, there is memorized a logic 1, when the first non-volatile memory element has a high threshold voltage and the second non-volatile memory element has a low threshold voltage, there is memorized a logic 0, and when both the non-volatile memory elements have high threshold voltages, there is memorized a don't care state.

4. A method of carrying out the search for a binary word stored in a CAM-type memory of the type of claim 1, comprising the following operations:

associating an element of a comparison register with each column of the matrix, inserting in the comparison register a word to be searched, comparing the content of the register bit by bit with the content of each row in accordance with the following operations:
    applying a first pre-determined voltage to the ground line,
    applying a second pre-determined voltage to the match line,
    applying a third pre-determined voltage to the word line,
    applying to the ground control line a fourth pre-determined voltage sufficient to close the electronic switch and to discharge the match node of the cells of the row and immediately afterwards applying the first pre-determined voltage to the same ground control line,
    subsequently biasing the bit lines of every column by applying a pre-determined search voltage to one of the first and the second bit line according to whether the respective bit of the comparison register is in a first or a second logic state,
    monitoring the voltage of the match line, and
    generating a match signal whenever the voltage on the match line does not vary or a no-match signal when the voltage on the match line varies.

5. The method of claim 4, wherein the bit line to which the pre-determined search voltage is not applied during the subsequent operation of biasing the bit lines is left unconnected.

6. The method of claim 4, wherein a reference voltage is applied to the bit line to which the pre-determined search voltage is not applied during the subsequent operation of biasing the bit lines.

7. The method of claim 4, wherein
the first pre-determined voltage applied to the ground line amounts to about 0V,
the second pre-determined voltage applied to the match line is in the range of between 0.8V and 1.8V,
the third pre-determined voltage applied to word line amounts to about 4V,
the fourth pre-determined voltage applied to the ground control line is in the range of between 5V and 8V, and
the pre-determined search voltage $V_{SEARCH}$ is in the range of between 1.2V and 2V.

8. The method of claim 4, wherein
the first pre-determined voltage applied to the ground line amounts to about 1.8V,
the second pre-determined voltage applied to the match line is in the range of between 0V and 0.5V, the third pre-determined voltage applied to word line amounts to about 4V, the fourth pre-determined voltage applied to the ground control line is in the range of between 5V and 8V, and the pre-determined search voltage $V_{SEARCH}$ is greater than the voltage applied to the ground line.

9. A memory cell, comprising;

a first transistor having a control gate coupled to a word line, a first terminal coupled to a first bit line, and a second terminal coupled to a first node;

a second transistor having a control gate coupled to the word line, a first terminal coupled to a second bit line, and a second terminal coupled to the first node;

a first switch having a control gate coupled to a control line, a first terminal coupled to the first node, and a second terminal coupled to a voltage source; and a second switch having a control gate coupled to the first node, a first terminal coupled to the voltage potential, and a second terminal coupled to a match line.

10. The memory cell of claim 9, wherein the first and second transistors comprise field effect transistors.

11. The memory cell of claim 9, wherein the first and second switches each comprise a transistor.

12. The memory cell of claim 9, wherein the first and second transistors and first and second switches are configured such that when the first transistor has a low threshold voltage and the second transistor has a high threshold voltage, there is stored therein a logic 1;

when the first transistor has a high threshold voltage and the second transistor has a low threshold voltage, there is stored therein a logic 0; and when the first and second transistors each have high threshold voltages, there is stored therein a don't care state.

13. A memory, comprising:

a plurality of memory cells arranged in rows and columns to form a memory matrix, each memory cell comprising:

a first transistor having a control gate coupled to a word line, a first terminal coupled to a first bit line, and a second terminal coupled to a first node;

a second transistor having a control gate coupled to the word line, a first terminal coupled to a second bit line, and a second terminal coupled to the first node;

a third transistor having a control gate coupled to a control line, a first terminal coupled to the first node, and a second terminal coupled to a voltage source; and a fourth transistor having a control gate coupled to the first node, a first terminal coupled to the voltage potential, and a second terminal coupled to a match line.

14. The memory of claim 13, wherein the first and second transistors comprise field effect transistors.

15. The memory of claim 13, wherein each memory cell is configured such that when the first transistor has a low threshold voltage and the second transistor has a high threshold voltage, there is stored therein a logic 1;

when the first transistor has a high threshold voltage and the second transistor has a low threshold voltage, there is stored therein a logic 0; and when the first and second transistors each have high threshold voltages, there is stored therein a don't care state.

16. A computer system, comprising:

a microprocessor and a memory associated therewith, the memory comprising a plurality of cells arranged in rows and columns to form a matrix, each cell comprising:

a first transistor having a control gate coupled to a word line, a first terminal coupled to a first bit line, and a second terminal coupled to a first node;

a second transistor having a control gate coupled to the word line, a first terminal coupled to a second bit line, and a second terminal coupled to the first node;

a third transistor having a control gate coupled to a control line, a first terminal coupled to the first node, and a second terminal coupled to a voltage source; and a fourth transistor having a control gate coupled to the first node, a first terminal coupled to the voltage potential, and a second terminal coupled to a match line.

17. The computer system of claim 16, wherein the first and second transistors comprise field effect transistors.

18. The computer system of claim 16, wherein each memory cell is configured such that when the first transistor has a low threshold voltage and the second transistor has a high threshold voltage, there is stored therein a logic 1;

when the first transistor has a high threshold voltage and the second transistor has a low threshold voltage, there is stored therein a logic 0; and when the first and second transistors each have high threshold voltages, there is stored therein a don't care state.

19. A method of searching a memory, the memory having a plurality of memory cells arranged in rows and columns, each cell having a first transistor having a control gate coupled to a word line, a first terminal coupled to a first bit line, and a second terminal coupled to a first node;

a second transistor having a control gate coupled to the word line, a first terminal coupled to a second bit line, and a second terminal coupled to the first node;

a first switch having a control gate coupled to a control line, a first terminal coupled to the first node, and a second terminal coupled to a voltage source; and a second switch having a control gate coupled to the first node, a first terminal coupled to the voltage potential, and a second terminal coupled to a match line, the method comprising:

comparing the contents of a comparison register associated with each column of the memory matrix bit by bit with the content of each row of the memory matrix in accordance with the following operations:

applying a first pre-determined voltage to the voltage potential;

applying a second pre-determined voltage to the match line;

applying a third pre-determined voltage to the word line;

applying to the control line a fourth pre-determined voltage sufficient to close the second electronic switch and to discharge the first node of the cells of the row and immediately afterwards applying the first pre-determined voltage to the same control line;

subsequently biasing the first and second bit lines of every column by applying a pre-determined search voltage to one of the first and the second bit lines according to whether the respective bit of the comparison register is in a first or a second logic state;

monitoring the voltage on the match line; and generating a match signal whenever the voltage on the match line does not vary and generating a no-match signal whenever the voltage on the match line varies.

* * * * *